(12) United States Patent
Sen

(10) Patent No.: US 10,652,057 B1
(45) Date of Patent: May 12, 2020

(54) ALL DIGITAL OUTPHASING TRANSMITTER

(71) Applicant: ASELSAN ELEKTRONİK SANAYI VE TICARET ANONIM SIRKETI, Ankara (TR)

(72) Inventor: Bulent Sen, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 0 days.

(21) Appl. No.: 16/615,155

(22) PCT Filed: Dec. 28, 2017

(86) PCT No.: PCT/TR2017/050716
§ 371 (c)(1),
(2) Date: Nov. 20, 2019

(87) PCT Pub. No.: WO2019/132790
PCT Pub. Date: Jul. 4, 2019

(51) Int. Cl.
*H03G 3/30* (2006.01)
*H04L 27/04* (2006.01)
(Continued)

(52) U.S. Cl.
CPC .............. *H04L 27/04* (2013.01); *H03F 3/19* (2013.01); *H04B 1/0475* (2013.01);
(Continued)

(58) Field of Classification Search
USPC .................................................. 375/260, 297
See application file for complete search history.

(56) References Cited

U.S. PATENT DOCUMENTS 9,160,287 B2 * 10/2015 Briffa ...................... H03F 1/025
9,294,079 B1 * 3/2016 Ma ............................ H03K 7/08
(Continued)

FOREIGN PATENT DOCUMENTS

EP         1372282 A2    12/2003

OTHER PUBLICATIONS

Mahwish Zahra "Linearity of Outphasing Radio Transmitters", Master of Science Thesis, May 5, 2014 (May 5, 2014).
(Continued)

*Primary Examiner* — Eva Y Puente
(74) *Attorney, Agent, or Firm* — Bayramoglu Law Offices LLC

(57) ABSTRACT

An all digital outphasing transmitter includes, at least one decomposition unit for decomposing an input signal to generate a first sub-signal and a second sub-signal; at least one outphasing signal generator to convert said first sub-signal to an outphasing signal; at least one delta sigma modulator to convert said second sub-signal to a delta sigma modulated signal; at least one mixing unit for mixing the outphasing signal and delta sigma modulated signal to generate a first and second mixed signal; at least one first amplifier for amplifying the first mixed signal; at least one second amplifier for amplifying the second mixed signal; at least one combiner for combining the first and second amplified mixed signals to generate a delta sigma modulated output signal and at least one band pass filter for filtering the delta sigma modulated output signal to recover the input signal envelope back on to the output signal.

4 Claims, 1 Drawing Sheet

(51) Int. Cl.
*H03F 3/19* (2006.01)
*H04B 1/04* (2006.01)

(52) U.S. Cl.
CPC ..... *H03F 2200/451* (2013.01); *H03G 3/3042* (2013.01); *H04B 2001/0408* (2013.01)

(56) References Cited

U.S. PATENT DOCUMENTS

| | | | | |
|---|---|---|---|---|
| 9,300,307 | B2* | 3/2016 | Juneau | H03L 7/18 |
| 10,038,461 | B2* | 7/2018 | Briffa | H03F 1/0216 |
| 10,171,115 | B1* | 1/2019 | Shirinfar | H04B 1/0475 |
| 2003/0107435 | A1* | 6/2003 | Gu | H03F 1/0294 |
| | | | | 330/149 |
| 2003/0125065 | A1* | 7/2003 | Barak | H03C 3/406 |
| | | | | 455/522 |
| 2008/0037662 | A1* | 2/2008 | Ravi | H03F 3/217 |
| | | | | 375/260 |
| 2008/0075194 | A1* | 3/2008 | Ravi | H03F 1/0294 |
| | | | | 375/297 |
| 2015/0222463 | A1 | 8/2015 | Hezar et al. | |
| 2016/0204970 | A1 | 7/2016 | Hori | |

OTHER PUBLICATIONS

Sung Won Chung, et al. "Concurrent Multiband Digital Outphasing Transmitter Architecture Using Multidimensional Dower Coding", Feb. 2015, IEEE Transactions on Microwave Theory and Techniques, vol. 63, No. 2.

Ildu Kim, Y. Y. Woo, S. Hong, B. Kim, "High Efficiency Hybrid EER Transmitter for WCDMA Application Using Optimized Power Amplifier", in Proc. of 37th Eur. Microw. Conf. Dig., Oct. 2007.

* cited by examiner

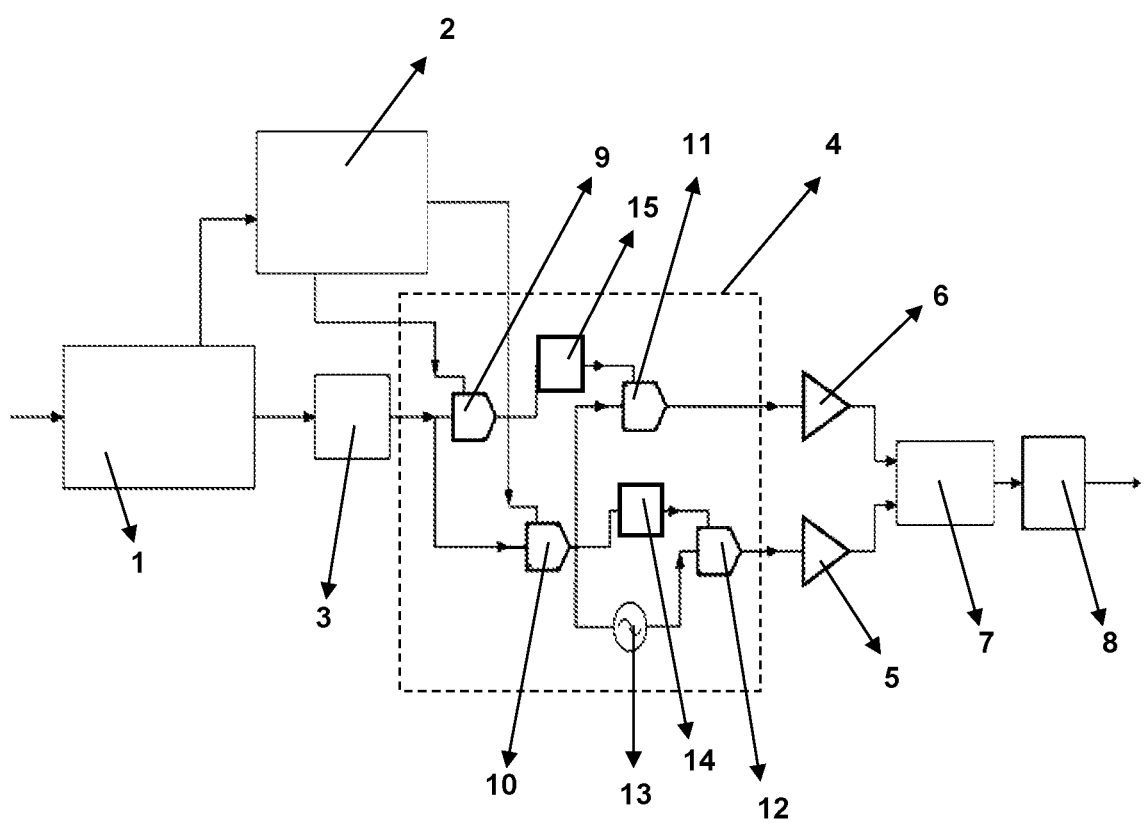

ALL DIGITAL OUTPHASING TRANSMITTER

CROSS REFERENCE TO THE RELATED APPLICATIONS

This application is the national phase of International Application No. PCT/TR2017/050716, filed on Dec. 28, 2017, the entire contents of which are incorporated herein by reference.

TECHNICAL FIELD

This invention is related to a digital RF outphasing transmitter with delta sigma modulation for future all digital wireless communication and radar systems.

BACKGROUND

Future wireless communication and radar systems make use of complex signals with high Peak to Average Power Ratio (PAPR). High peak to average power ratio degrades efficiency performance of RF power amplifiers which results in power hungry transmitter design. On the other hand, high peak to average power ratio also dictates linear power amplification to maintain signal quality and spectral efficiency, which then compromise efficient use of power sources. RF outphasing transmitters lead the way to efficiently amplify amplitude varying wireless communication signals with switch mode RF power amplifiers.

Increasing demands in modern wireless communication systems, like high data rate and spectral efficiency lead to sophisticated and complex waveforms. These signal requirements are met with complex modulation schemes, which include amplitude, phase and frequency modulations, combined all together. Varying amplitude wireless communication signals require new transmitter architectures for an efficient and linear power amplification. Efficiency is needed to save energy sources and to use wireless devices for longer time; whereas linearity is essential to achieve high spectral efficiency and good signal quality.

In the known art, several transmitter architectures have been offered to amplify wireless communication signals. One of the known applications is Envelope Elimination and Restoration (EER) as disclosed in the Kim, Y. Y. Woo, S. Hong, B. Kim, "High efficiency hybrid EER transmitter for WCDMA application using optimized power amplifier", in Proc. of 37th Eur. Microw. Conf. Dig., October 2007. However, envelope elimination and restoration transmitter requires a supply modulator to maintain high efficiency, which brings circuit complexity and shows limited efficiency performance for wideband signals.

SUMMARY

With the present application, an outphasing transmitter with high efficiency is provided. Said outphasing transmitter comprises, at least one decomposition unit for decomposing an input signal to generate a first sub-signal and a second sub-signal; at least one outphasing signal generator to convert said first sub-signal to an outphasing signal; at least one delta sigma modulator to convert said second sub-signal to a delta sigma modulated signal; at least one mixing unit for mixing the outphasing signal and delta sigma modulated signal together to generate a first mixed signal and a second mixed signal; at least one first amplifier for amplifying the first mixed signal; at least one second amplifier for amplifying the second mixed signal; at least one combiner for combining the amplified first mixed signal and amplified second mixed signal to generate a delta sigma modulated output signal and at least one band pass filter for filtering the delta sigma modulated output signal to recover the input signal envelope back on to the output signal.

The main object of the invention is to provide an all digital outphasing transmitter to be used in wireless communication and radar systems.

Another object of the invention is to provide an all digital outphasing transmitter with low combiner loss, which results in high efficiency at the transmitter output.

BRIEF DESCRIPTION OF THE DRAWINGS

FIGURE shows a block diagram of the outphasing transmitter of the present invention.

Decomposition unit (1)
Outphasing signal generator (2)
Delta sigma modulator (3)
Mixing unit (4)
First amplifier (5)
Second amplifier (6)
Combiner (7)
Band pass filter (8)
First mixer (9)
Second mixer (10)
Third mixer (11)
Forth mixer (12)
Signal generator (13)
First Low Pass Filter (14)
Second Low Pass Filter (15)

DETAILED DESCRIPTION OF THE EMBODIMENTS

RF outphasing transmitter facilitates the use of switch mode RF power amplifiers for an efficient amplification of amplitude varying signals. However, the RF power combiner gives considerable loss when the peak to average power ratio of the applied signal is high enough. In such a situation, it is combining loss should be kept at a tolerable level. Therefore, according to the present invention, an outphasing transmitter with high efficiency is achieved.

A block diagram of the outphasing transmitter of the present invention is shown in FIGURE. Said outphasing transmitter comprises at least one decomposition unit (1) for decomposing an input signal to generate a first sub-signal ($\rho(n)$) and a second sub-signal ($\delta(n)$); at least one outphasing signal generator (2) to convert said first sub-signal ($\rho(n)$) to an outphasing signal ($\emptyset(n)$); at least one delta sigma modulator (3) to convert said second sub-signal ($\delta(n)$) to a delta sigma modulated signal ($h(n)$); at least one mixing unit (4) for mixing the outphasing signal ($\emptyset(n)$) and delta sigma modulated signal ($h(n)$) together to generate a first mixed signal and a second mixed signal; at least one first amplifier (5) for amplifying the first mixed signal; at least one second amplifier (6) for amplifying the second mixed signal; at least one combiner (7) for combining the amplified first mixed signal and amplified second mixed signal to generate delta sigma modulated output signal and at least one band pass filter (8) for filtering the delta sigma modulated output signal.

In a preferred embodiment of the present application, said mixing unit (4) comprises, at least one first mixer (9) for modulating the negative phased outphasing signal with the delta sigma modulated signal; at least one second mixer (10)

for modulating the positive phased outphasing signal with the delta sigma modulated signal; at least one third mixer (11) for upconverting negative phased delta sigma modulated outphasing signal to an RF carrier frequency; at least one forth mixer (12) for upconverting positive phased delta sigma modulated outphasing signal to an RF carrier frequency; at least one signal generator (13) (such as a clock generator or an RF signal generator) for generating a carrier radio frequency signal to be used for upconversions. Said mixing unit (4) preferably further comprises at least one first low pass filter (14) for filtering the output of the second mixer (10) (in order to reject higher order mixing products of the negative phased delta sigma modulated outphasing signal) and at least one second low pass filter (15) for filtering the output of the first mixer (9) (in order to reject higher order mixing products of the positive phased delta sigma modulated outphasing signal).

In another preferred embodiment of the present application, said combiner (7) is in the form of a Chireix combiner. In this embodiment, Chireix combiner is one of the key components in the application. The combiner is designed together with the Class D RF power amplifier to get high combining efficiency. With the technique, the combining efficiency at the Chireix combiner will be higher than the efficiency FIGURE without the technique. Because, the technique reduces time variation (variance) of the outphasing angle by reducing peak to average power ratio of the input signal, which concludes high combining efficiency.

In an exemplary embodiment of the present invention, an envelope signal is decomposed into two signals with lower peak to average power ratio by the decomposition unit (1). The criteria upon decomposition is based on locating the maximum probability distribution function at a required outphasing angle, which gives tolerable loss at the combiner (7). Tolerable loss is defined as the amount which does not compromise the efficiency that is gained with outphasing topology at the switched mode power amplifier. When the envelope signal is decomposed, a first sub-signal ($\rho(n)$) and a second sub-signal ($\delta(n)$) are generated. First sub-signal ($\rho(n)$) is used for generating an outphasing signal ($\emptyset(n)$) and second sub-signal ($\delta(n)$) is used for generating a delta sigma modulated signal ($h(n)$). Generated outphasing signal ($\emptyset(n)$) and delta sigma modulated signal ($h(n)$) are mixed together and amplified. Then, amplified signals are combined by said combiner (7). Finally, the combined digital signal is passed through the band pass filter (8) to recover the original wireless and/or radar signal.

Outphasing conversion formula and the algorithm of the above-mentioned system are given below:

$$x(t)=a(t) \times \cos(\omega t + \theta(t)) \quad [1]$$

$$\emptyset(t)=\cos^{-1}[|x(t)|/\max\{|x(t)|\}] \quad [2]$$

x(t) is the amplitude and phase modulated signal;

$\emptyset(t)$ is the outphasing angle

1. Design a Chireix combiner together with the Class D RF power amplifier to get minimum transmission loss at an outphasing angle, $\emptyset_{req}$;
2. $\emptyset_{req}$ is the outphasing angle which results in high combining efficiency at the outphasing transmitter output.
3. Calculate envelope signal $a(n)=abs(x(n))$, n=1 to M, M is the length of x(n)
4. Generate a bottom-clipped envelope signal $a_C(n)$ such that $$\text{ClippingLevel}=(i/L) \times \min(a(n))$$

$$a_C(n)=a(n),$$

where, $\min(a_c(n))=\min(a(n))-\text{ClippingLevel})$ where i is an integer and takes value from 0 to L, L is the number of clipping steps 5. Calculate outphasing angle, $$\emptyset_{est}(n)=\cos^{-1}[a_C(n)/\max(a_C(n))]$$

6. Calculate pdf ($\emptyset_{est}(n)$), probability distribution function
7. If max [pdf ($\emptyset_{est}(n)$)]−$\emptyset_{req}$ ≤ ∈

Then $\emptyset_{req}(n)=\emptyset_{est}(n)$, required outphasing angle $\rho(n)=a_C(n)$, regenerated outphasing envelope signal Else increase i and go back to 4

8. $\delta(n)=a(n)/\rho(n)$, complementary signal
9. Digitally modulate $\delta(n)$ with delta sigma conversion algorithm, $h(n)=dsm(\delta(n))$
10. Interpolate h, $\theta$ and $\emptyset_{req}$ with N=M×$f_S$/$f_C$, $f_S$ is the sampling frequency and $f_C$ is the carrier frequency
11. $Y(k)=h(k) \times \cos(2\pi f_C k/N + \theta(k) \pm \emptyset_{req}(k))$, Here, Y(k) represents the two digitally modulated outphasing signals with ±sign.

Time averaged power efficiency rather than maximum efficiency is more reasonable to qualify an RF transmitter in terms of power saving performance. Besides the peak to average power ratio, the probability density function of the input signal should be considered equally to comprehend the average efficiency performance.

After decomposition, delta sigma modulation is applied to the complementary signal. The primary advantages of using delta sigma modulation are the ability to send in-band noise out of the region of interest and convert the amplitude varying signal to a digital signal with constant amplitude. The former enhances the signal to noise ratio (SNR); while the latter is used to put the RF power amplifier into saturation to obtain the highest efficiency. Delta sigma modulation order and oversampling ratio are the two most critical parameters to tweak. The higher the oversampling ratio and the order are taken, the more the in-band quantization is rejected.

What is claimed is:

1. An outphasing transmitter comprising;
   at least one decomposition unit for decomposing an input signal to generate a first sub-signal and a second sub-signal;
   at least one outphasing signal generator to convert the first sub-signal to an outphasing signal;
   at least one delta sigma modulator to convert the second sub-signal to a delta sigma modulated signal;
   at least one mixing unit for mixing the outphasing signal and the delta sigma modulated signal together to generate a first mixed signal and a second mixed signal;
   at least one first amplifier for amplifying the first mixed signal;
   at least one second amplifier for amplifying the second mixed signal;
   at least one combiner for combining an amplified first mixed signal and amplified second mixed signal to generate a delta sigma modulated output signal and at least one band pass filter for filtering the delta sigma modulated output signal to recover an input signal envelope back on to an output signal.

2. The outphasing transmitter according to claim 1, wherein, the mixing unit comprises: at least one first mixer for modulating a negative phased outphasing signal with the delta sigma modulated signal; at least one second mixer for modulating a positive phased outphasing signal with the delta sigma modulated signal; at least one third mixer for upconverting a negative phased delta sigma modulated outphasing signal to an RF carrier frequency; at least one fourth mixer for upconverting the positive phased delta sigma modulated outphasing signal to the RF carrier frequency; at least one signal generator for generating a carrier radio frequency signal to be used for upconversions.

3. The outphasing transmitter according to claim 2, wherein, the said mixing unit further comprises at least one first low pass filter for filtering an output of the second mixer and at least one second low pass filter for filtering an output of the first mixer.

4. The outphasing transmitter according to claim 1, wherein, the combiner is in a form of a Chireix combiner.

\* \* \* \* \*